(12) United States Patent
Corbo et al.

(10) Patent No.: US 9,301,605 B2
(45) Date of Patent: Apr. 5, 2016

(54) RACK FRAME ASSEMBLY

(71) Applicant: Middle Atlantic Products, Inc., Fairfield, NJ (US)

(72) Inventors: Nico Corbo, Blairstown, NJ (US); John Franetovich, Glenwood, NJ (US); Richard Fluhr, Ogdensburg, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 25 days.

(21) Appl. No.: 14/494,096

(22) Filed: Sep. 23, 2014

(65) Prior Publication Data

US 2015/0257532 A1  Sep. 17, 2015

Related U.S. Application Data

(60) Provisional application No. 61/952,525, filed on Mar. 13, 2014.

(51) Int. Cl.
*A47B 47/02* (2006.01)
*H04Q 1/02* (2006.01)
(Continued)

(52) U.S. Cl.
CPC .............. *A47B 47/027* (2013.01); *H02B 1/013* (2013.01); *H04Q 1/09* (2013.01); *H05K 7/18* (2013.01); *A47B 47/0083* (2013.01); *H02B 1/012* (2013.01); *H02B 1/301* (2013.01)

(58) Field of Classification Search
CPC .......... H02B 1/01; H02B 1/014; H02B 1/012; H02B 1/013; H02B 1/301; H02B 1/30; H05K 7/18; H05K 7/183; H05K 7/1489; H05K 7/1488; H05K 5/0052; H05K 5/04; H05K 5/02; A47B 47/0083; A47B 47/02; A47B 47/021; A47B 47/027; A47B 47/00; A47B 47/03; H04Q 1/09
USPC ................ 211/26, 189; 312/265.1–265.6, 140
See application file for complete search history.

(56) References Cited

U.S. PATENT DOCUMENTS 3,265,419 A * 8/1966 Durnbaugh ............. F16B 12/08
312/265.1
3,353,854 A * 11/1967 Hansen ................. E04B 1/5818
403/171

(Continued)

FOREIGN PATENT DOCUMENTS

FR          2937114 A1    4/2010
WO      2009035245 A1    3/2009

OTHER PUBLICATIONS

Extended European Search Report for EP 15 15 8583, dated Jan. 14, 2016, 5 pages.

*Primary Examiner* — Patrick Hawn
(74) *Attorney, Agent, or Firm* — Drinker Biddle & Reath LLP

(57) ABSTRACT

An end unit has an end wall and first and second side walls forming a corner. One end of an L-shaped rail with first and second flanges seats in the corner against the end wall, with the flanges flat against the side walls. One side wall has a protrusion abutting the first flange to restrict movement of the rail away from the other side wall. The first side wall has a tab in a slot in the first flange, engaging the flange on a side of the slot away from the end wall, preventing movement of the rail away from the first side wall, while permitting movement of the rail away from the end wall to a position where the tab aligns with the slot to permit movement of the rail away from the first side wall. A pin in aligned holes prevents the movement away from the end wall.

16 Claims, 4 Drawing Sheets

(51) Int. Cl.
*H05K 7/18* (2006.01)
*H02B 1/30* (2006.01)
*H02B 1/01* (2006.01)
*A47B 47/00* (2006.01)

(56) References Cited

U.S. PATENT DOCUMENTS

| | | | |
|---|---|---|---|
| 3,919,603 A * | 11/1975 | Salvati | H02B 1/01 211/182 |
| 4,632,473 A * | 12/1986 | Smith | A47B 47/03 211/182 |
| 4,782,637 A * | 11/1988 | Eriksson | E04B 1/3483 312/111 |
| 5,498,073 A * | 3/1996 | Charbonneau | H02B 1/01 312/257.1 |
| 5,593,048 A | 1/1997 | Johnson | |
| 5,797,503 A | 8/1998 | Stevens et al. | |
| 5,806,945 A * | 9/1998 | Anderson | A47B 96/145 312/265.3 |
| 6,174,034 B1 * | 1/2001 | Benner | H02B 1/301 211/26 |
| 6,238,029 B1 * | 5/2001 | Marzec | H02B 1/30 211/26 |
| 6,315,132 B1 * | 11/2001 | Hartel | H02B 1/301 211/189 |
| 6,315,136 B1 | 11/2001 | Baldoni et al. | |
| 6,516,955 B1 * | 2/2003 | Dudhwala | A47B 47/0008 211/182 |
| 6,776,297 B2 | 8/2004 | Eustace | |
| 6,971,529 B1 | 12/2005 | Shapiro | |
| 6,974,036 B2 * | 12/2005 | Wyatt | A47B 96/1408 211/189 |
| 7,097,053 B1 | 8/2006 | Karl et al. | |
| 7,128,225 B2 | 10/2006 | Saltzburg et al. | |
| 7,252,202 B2 | 8/2007 | Saltzberg et al. | |
| 7,337,729 B2 | 3/2008 | Briosi | |
| 7,353,958 B2 | 4/2008 | Shapiro | |
| 7,364,243 B2 * | 4/2008 | Wyatt | H02B 1/30 211/182 |
| 7,478,890 B2 | 1/2009 | Hudz et al. | |
| 7,992,731 B2 | 8/2011 | Mcallister et al. | |
| 8,042,477 B2 | 10/2011 | Lee | |
| 8,074,583 B2 | 12/2011 | Lee | |
| 8,083,301 B2 | 12/2011 | Hudz et al. | |
| 8,091,970 B2 * | 1/2012 | Francisquini | H02B 1/301 211/192 |
| 8,128,183 B2 | 3/2012 | Shen et al. | |
| 8,302,788 B2 | 11/2012 | Vargo | |
| 8,625,288 B1 | 1/2014 | Liu et al. | |
| 2003/0214205 A1 * | 11/2003 | Wyatt | H02B 1/30 312/265.4 |
| 2004/0016713 A1 * | 1/2004 | Wyatt | A47B 96/1408 211/183 |
| 2004/0075371 A1 * | 4/2004 | Latchinian | A47F 3/004 312/140 |
| 2006/0138062 A1 | 6/2006 | Dahmer et al. | |
| 2006/0157436 A1 | 7/2006 | Iwamoto | |
| 2007/0056917 A1 * | 3/2007 | Wyatt | A47B 96/1408 211/26 |
| 2007/0125737 A1 | 6/2007 | O'Reilly | |
| 2008/0308516 A1 | 12/2008 | Li | |
| 2009/0001863 A1 * | 1/2009 | Wyatt | H02B 1/30 312/265.3 |
| 2010/0200716 A1 | 8/2010 | White, III | |
| 2012/0292278 A1 * | 11/2012 | Schluter | H05K 7/1421 211/183 |
| 2013/0126454 A1 | 5/2013 | Zang et al. | |
| 2013/0249363 A1 * | 9/2013 | Liu | H05K 7/18 312/265.1 |
| 2015/0002006 A1 * | 1/2015 | Segroves | H05K 7/1491 312/236 |

* cited by examiner

RACK FRAME ASSEMBLY

CROSS REFERENCE TO RELATED APPLICATION

The application claims benefit of U.S. provisional patent application No. 61/952,525, filed on Mar. 13, 2014 by Corbo et al. for a "Rack Frame Assembly," the entire contents of which are incorporated by reference as if set forth fully herein.

BACKGROUND

The invention relates to an improved metal rack frame assembly for electronics equipment that facilitates assembly of the frame. Most frame assemblies include a top shelf, a base, and four vertical support rails that are screwed into the top and base through the use of generally 32 screws and multiple components, which makes assembly time consuming. The present invention reduces the screws down to 8 through a uniquely designed set of components.

SUMMARY

One aspect of the invention provides an assembly for a frame, comprising an end unit comprising an end wall, a first side wall extending perpendicularly from the end wall, and a second side wall extending perpendicularly from the end wall and forming a corner with the first side wall; and an elongate rail, comprising a first flange and a second flange together forming an L-shaped cross section. In a first position one end of the rail is seated in the corner, with an end face of the rail against the end wall, the first flange flat against the first side wall, and the second flange flat against the second side wall.

The first side wall has at least one protrusion abutting an outer edge of the first flange in the first position to laterally restrict movement of the rail away from the second side wall parallel to the end wall and the first side wall. The first side wall has at least one tab extending through a slot in the first flange and engaging the first flange adjacent to the slot on a side of the slot away from the end wall, the tab in the first position preventing movement of the rail away from the first side wall parallel to the end wall and the second side wall, while permitting movement of the rail away from the end wall to a second position where the at least one tab aligns with the at least one slot to permit movement of the rail away from the first side wall.

The second side wall has a hole aligning with a hole in the second flange in the first position, the aligned holes receiving a pin preventing relative movement of the rail and the end unit from the first position to the second position.

The assembly may comprise two of the end units, each having two of the first side walls and two of the second side walls together forming four corners, and four of the rails, each rail having two ends and positioned with one end in a respective corner of one end unit, and with its other end in a respective corner of the other end unit.

Another aspect of the invention provides a frame for a rack, comprising a base comprising a bottom wall, two first base side walls extending upwards from the bottom wall, and two second base side walls extending upwards from the bottom wall alternately with the first base side walls, the two first base side walls and two second base side walls forming four corners; a top shelf comprising a top wall, two first top side walls extending downwards from the top wall, and two second top side walls extending downwards from the top wall alternately with the first top side walls, the two first top side walls and two second top side walls forming four corners; and four elongate rails, each comprising a first flange and a second flange together forming an L-shaped cross section.

In a first position, each rail extends from the top wall to the bottom wall in respective corners of the top shelf and of the base, with its first flange against one of the first base side walls and one of the first top side walls, and its second flange against one of the second base side walls and one of the second top side walls.

The respective first base side wall and first top side wall each have at each corner at least one protrusion abutting an outer edge of the first flange of the respective rail to prevent movement of the rail away from the respective second base side wall and second top side wall in the first position. The respective first base side wall and first top side wall each have at each corner at least one tab extending through a slot in the first flange and engaging the first flange adjacent to the slot on a side of the slot away from the respective top wall or bottom wall, the tabs preventing movement of the rail away from the respective first base side wall and first top side wall in the first position, while permitting movement of the rail away from the base wall and the top wall to a second position where the tabs align with the slots to permit movement of the rail away from the respective first base side wall and first top side wall.

The second base side walls and second top side walls each have at each corner a hole aligning with a respective hole in the second flange in the first position, each pair of aligned holes receiving a pin preventing relative movement of the rail and the top shelf or the base, respectively, from the first position to the second position.

At least one end wall, or the top wall and/or the base wall, may comprise a planar flange defining an aperture.

The pin, or each of the pins, may include a screw thread that engages with a screw thread in one of the aligned holes, the pin being retained in the aligned holes by engagement of the screw threads.

The aforementioned at least one protrusion may comprise at least two protrusions. At least one of the protrusions may then be closer to the neighboring top, base, or end wall than is the hole in the second side wall, and at least one of the protrusions may then be further from the top, base, or end wall than is the hole in the second side wall.

The aforementioned at least one tab may comprise at least two such tabs spaced apart perpendicular to the top, base, or end wall, the at least one slot in the first flange may comprise at least two slots, and the tabs may extend through respective slots.

One of the first and second side walls may comprise a first web upstanding from the end wall, a second web extending inwards generally in a plane parallel to the end wall, and a third web upstanding from an inner edge of the second web. In the first position the respective flange of the rail may then be flat against the third web of that side wall. The top and base walls may comprise matching first, second, and third webs on the same side of the frame.

Another aspect of the invention provides a set of parts for the aforementioned frame, comprising at least a base, a top shelf, and four rails.

The set of parts may further comprise eight pins.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE FIGURES

For the purpose of illustrating the invention, the drawings show a form of the invention which is presently preferred. However, it should be understood that this invention is not limited to the precise arrangements and instrumentalities shown in the drawings.

DETAILED DESCRIPTION OF THE INVENTION

Figure 1:
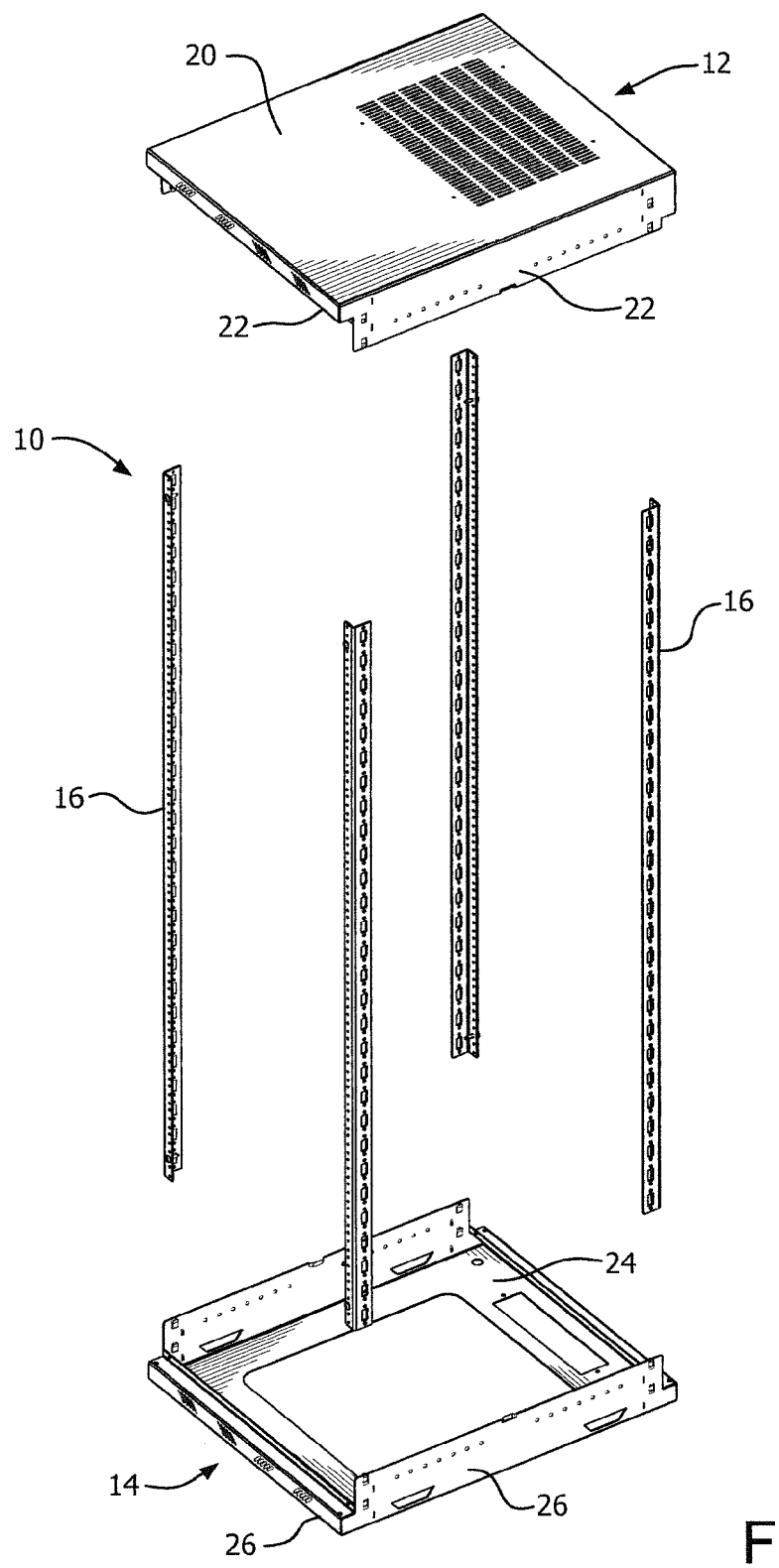
FIG. 1 is an exploded view of the frame assembly according to the present invention.

As shown in the figures, the assembly 10 includes a top shelf 12, a base 14, and four or more vertical rails 16. Each end of each vertical rail attaches to the top shelf with one pin, which in this embodiment is in the form of a screw or bolt 18 and the base with one pin, which in this embodiment is in the form of a screw or bolt 18. The top shelf 12 includes a top wall 20, and four side walls 22 that generally project downward from the top wall 20. For simplicity the top side walls 22 are referenced as 22A, 22B, 22C, 22D in the figures. Similarly, the base includes a bottom wall 24 and four side walls 26 that generally project upward from the bottom wall 24. As shown for the bottom wall 24 in FIGS. 1 and 2, either or both of the top and bottom walls 20 and 24 may be in the form of a planar flange surrounding an opening. For simplicity, the base side walls 26 are referenced as 26A, 26B, 26C, 26D in the figures. As may be seen from the drawings, the top wall 20 and the top side walls 22 may be formed from a single piece of sheet metal or other suitable material. Similarly, the bottom wall 24 and the base side walls 26 may be formed from a single piece of sheet metal or other suitable material.

Figure 3:
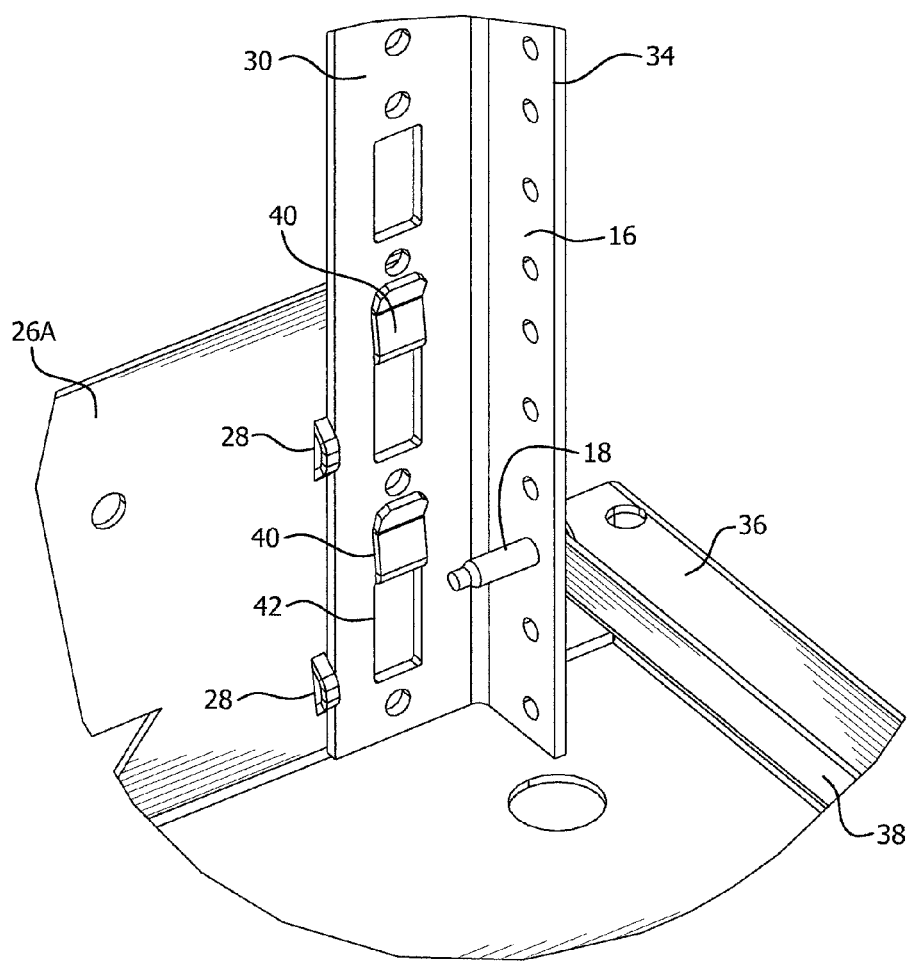
FIG. 3 is an enlarged inside view of one corner of the base of the frame in FIG. 2, illustrating the attachment of the vertical rails to the base.
Figure 4:
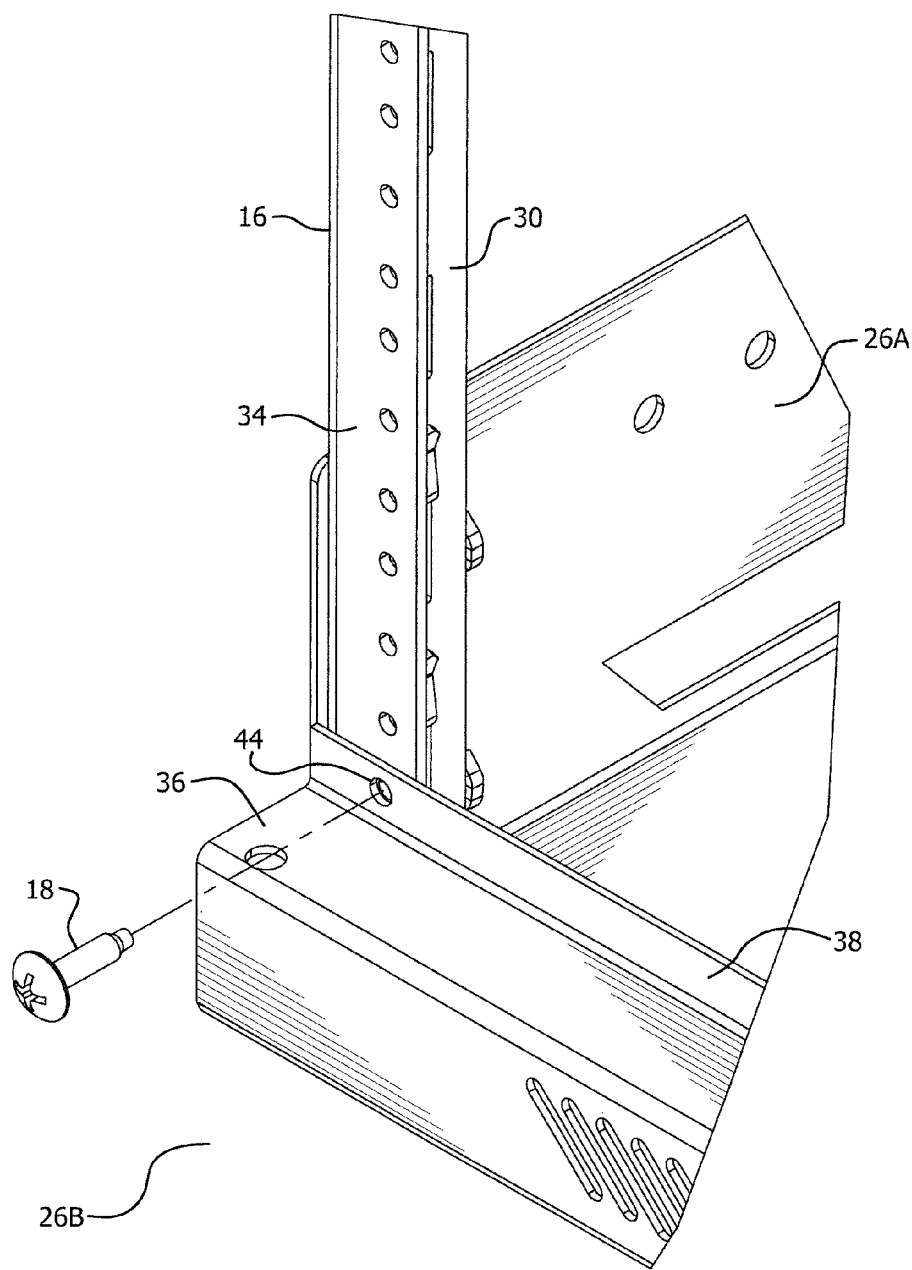
FIG. 4. is a view of FIG. 3 from the outside showing how one screw attaches and secures the rail to the base.

At least two of the side walls 22A, 22C on the top shelf and two of the side walls 26A, 26C of the base include at least one or more inwardly projecting protrusions or stubs 28 on each end of the side walls 22A, 22C, 26A, 26C. For simplicity, the following description will refer to the components on the base 14. However, it is intended that the same connection can also be used on the top shelf 12. The protrusions 28 are preferably formed as an inwardly pressed piece of the side wall 26A, 26C. Preferably there are two protrusions 28 on each end of the side walls 26A, 26C. The protrusions 28 are spaced from the end of the side wall a sufficient distance to receive a first side flange 30 of one vertical rail 16 so as to laterally restrict movement of the rail in the plane of the side wall 26A, 26C as shown in FIG. 3.

A second side flange 34 of the vertical rail 16 is positioned against an adjacent side wall 26B, 26D. More particularly, as shown in FIG. 3, the bottom wall 24 projects outwards beyond the rails 16. A vertical first web forming the first part of the adjacent side wall 26B, 26D rises from the outer edge of the bottom wall 24. The adjacent side wall 26B, 26D preferably includes a flange or second web 36 extending inwards from the top of the first web, parallel to the plane of the bottom wall 24. At the inner end of the second web 36 is a vertical flange or third web 38 against which the second side flange 32 of the vertical rail 16 rests. The top shelf 12 has a similar projection. The projections permit a door or cover panel (not shown) to be installed, with the outer face of the door flush with the vertical first webs. The projections may be provided on only one side of the frame assembly or, as shown in the drawings, on two opposite sides.

A screw or bolt 18 attaches the vertical flange 36 to the third web 38 of the second side flange 32. Thus, side walls 26B, 26D and the protrusions 28 prevent any lateral movement of the vertical rails along the plane of side wall 26A, 26C, and the screw or bolt 18 and side walls 26A, 26C prevent any lateral movement of the vertical rails 16 along the plane of side walls 26B, 26D. The screw or bolt 18 also prevents the removal of the rail from the top/base.

Figure 2:
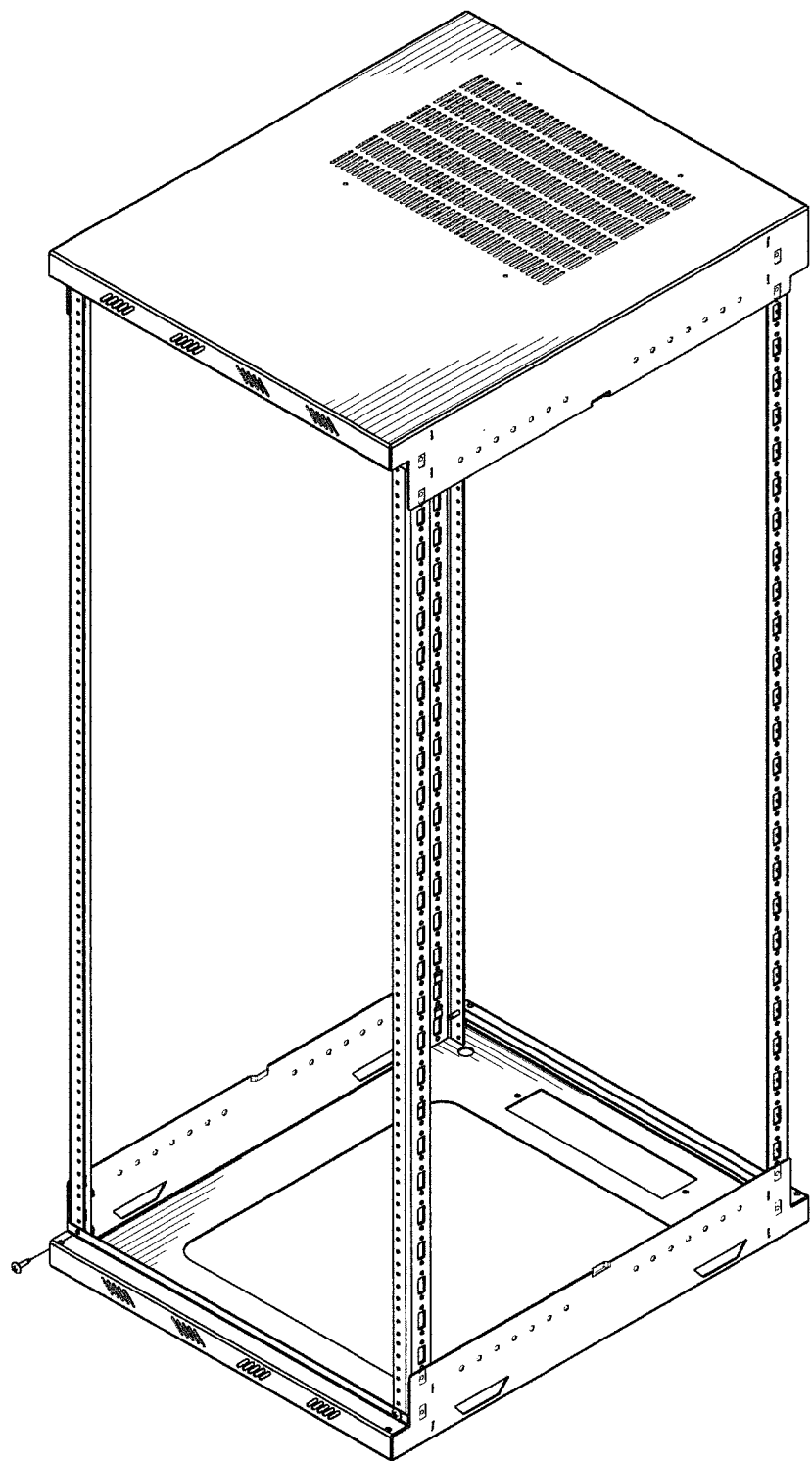
FIG. 2 is a fully assembled view of the frame assembly of FIG. 1.

To further secure the rails 16 to the base 14, the side walls 26A, 26C include tabs 40 that extend inward from the side walls 26A, 26C and include a joggled portion that is bent upward as shown (the tabs on the top shelf which are shown in less detail in FIGS. 1 and 2 are, of course, bent downward). The tabs 40 are preferably formed from a punched section of the side wall 26A, 26C. The tabs 40 are spaced away from the side wall 26A, 26C a sufficient distance to receive the first side flange 30 of the rail 16. As shown, the first side flange 30 includes one or more slots 42 which are cut into the rail 16 and are sized to receive the tabs 40. In the illustrated embodiment, there are two tabs 40 located at each end of each side wall 26A, 26C of the base. The first side flange 30 of each rail 16 has at least two slots 42 formed at each end and that are vertically spaced and aligned with each other and configured to engage with the tabs 40.

While one corner is shown in the figures, it should be readily apparent that all four corners of the base and the top would preferably have similar features, assembled in the similar manner.

To assemble the frame, the slots 42 in a rail 16 are aligned with the tabs 40 in the side wall 26A and then the rail is slid downward so that the tabs engage the first side flange 30. A screw or bolt 18 is then placed through a hole 44 in the vertical flange 38 to secure the vertical flange 38 of the side wall 26B to the second side flange 34 of the vertical rail 16. This is repeated with the remaining three vertical rails 16 on the base 24. The top shelf 12 is then attached in a similar fashion to the other end of the vertical rails 16.

Thus the entire rack frame assembly 10 consists of six components 12, 14, and 16 and eight screws 18.

While the invention has been disclosed with reference to certain preferred embodiments, numerous modifications, alterations, and changes to the described embodiments are possible without departing from the sphere and scope of the invention, as defined in the appended claims and equivalents thereof. Accordingly, it is intended that the invention not be limited to the described embodiments, but that it have the full scope defined by the language of the following claims.

What is claimed is:

1. An assembly for a frame of an electronics rack, comprising:
    an end unit comprising an end wall, a first side wall extending perpendicularly from the end wall, and a second side wall extending perpendicularly from the end wall and forming a corner with the first side wall;
    an elongated rail, comprising a first flange and a second flange together forming an L-shaped cross section;
    wherein in a first position one end of the rail is seated in the corner, with an end face of the rail against the end wall, the first flange flat against the first side wall, and the second flange flat against the second side wall;

wherein the first side wall has at least one protrusion abutting an outer edge of the first flange in the first position to laterally restrict movement of the rail away from the second side wall parallel to the end wall and the first side wall;

wherein the first side wall has at least one tab extending through a slot in the first flange and engaging the first flange adjacent to the slot on a side of the slot away from the end wall, the tab in the first position preventing movement of the rail away from the first side wall parallel to the end wall and the second side wall, while permitting movement of the rail away from the end wall to a second position where the at least one tab aligns with the at least one slot to permit movement of the rail away from the first side wall; and wherein the second side wall has a hole aligning with a hole in the second flange in the first position, the aligned holes receiving a pin preventing relative movement of the rail and the end unit from the first position to the second position.

2. An assembly according to claim 1, comprising two said end units, each having two said first side walls and two said second side walls together forming four said corners, and four said rails, each rail having two said ends and positioned with one end in a respective said corner of one said end unit, and with its other end in a respective said corner of the other said end unit.

3. An assembly according to claim 2, wherein at least one said end wall comprises a planar flange defining an aperture.

4. An assembly according to claim 1, wherein said pin includes a screw thread that engages with a screw thread in one of said aligned holes, said pin being retained in said aligned holes by engagement of the screw threads.

5. An assembly according to claim 1, wherein said at least one protrusion comprises at least two protrusions, at least one said protrusion is closer to said end wall than is said hole in said second side wall, and at least one said protrusion is further from said end wall than is said hole in said second side wall.

6. An assembly according to claim 1, wherein said at least one tab comprises at least two said tabs spaced apart perpendicular to the end wall, said at least one slot in the first flange comprises at least two slots, and respective said tabs extend through respective said slots.

7. An assembly according to claim 1, wherein one of said first and second side walls comprises a first web upstanding from said end wall, a second web extending inwards generally in a plane parallel to said end wall, and a third web upstanding from an inner edge of said second web, and wherein when in said first position the respective flange of said rail is flat against said third web of said one side wall.

8. A frame for an electronics rack, comprising:
a base comprising a bottom wall, two first base side walls extending upwards from the bottom wall, and two second base side walls extending upwards from the bottom wall alternately with the first base side walls, said two first base side walls and two second base side walls forming four corners;
a top shelf comprising a top wall, two first top side walls extending downwards from the top wall, and two second top side walls extending downwards from the top wall alternately with the first top side walls, said two first top side walls and two second top side walls forming four corners; and
four elongate rails, each comprising a first flange and a second flange together forming an L-shaped cross section;

wherein in a first position each rail extends from the top wall to the bottom wall in respective corners of the top shelf and of the base, with its first flange against one of the first base side walls and one of the first top side walls, and its second flange against one of the second base side walls and one of the second top side walls;

wherein the respective first base side wall and first top side wall each have at each corner at least one protrusion abutting an outer edge of the first flange of the respective rail to prevent movement of the rail away from the respective second base side wall and second top side wall in the first position;

wherein the respective first base side wall and first top side wall each have at each corner at least one tab extending through a slot in the first flange and engaging the first flange adjacent to the slot on a side of the slot away from the respective top wall or bottom wall, the tabs preventing movement of the rail away from the respective first base side wall and first top side wall in a direction parallel to the bottom and top wall in the first position, while permitting movement of the rail away from the base wall and the top wall to a second position where the tabs align with the slots to permit movement of the rail away from the respective first base side wall and first top side wall; and wherein the second base side walls and second top side walls each have at each corner a hole aligning with a respective hole in the second flange in the first position, each pair of aligned holes receiving a pin preventing relative movement of the rail and the top shelf or the base, respectively, from the first position to the second position.

9. A frame according to claim 8, wherein said pins include screw threads that engage with screw threads in one of each pair of said aligned, said pins being retained in said aligned holes by engagement of said screw threads.

10. A frame according to claim 8, wherein said at least one protrusion at each corner comprises at least two protrusions, at least one said protrusion is closer to the respective top or bottom wall than is said hole in said second side wall, and at least one said protrusion is further from the respective top or bottom wall than is said hole in said second side wall.

11. A frame according to claim 8, wherein said at least one tab at each corner comprises at least two said tabs spaced apart perpendicular to the respective top or bottom wall and extending through respective said slots in the respective first side flange.

12. A frame according to claim 8, wherein at least one of said top shelf and said bottom wall comprises a planar flange defining an aperture.

13. A frame according to claim 8, wherein each of said first side walls or each of said second side walls comprises a first web upstanding from said end wall, a second web extending inwards generally in a plane parallel to said end wall, and a third web upstanding from an inner edge of said second web, and wherein in said first position the respective flange of the respective said rail is flat against said third web of the respective side wall.

14. A set of parts for a frame according to claim 8, comprising at least said base, top shelf, and four rails.

15. A set of parts according to claim 14, comprising at least eight pins.

16. An assembly for a frame of an electronics rack, comprising:
an end unit comprising an end wall, a first side wall extending perpendicularly from the end wall, and a second side wall extending perpendicularly from the end wall and forming a corner with the first side wall;

an elongate rail, comprising a first flange and a second flange together forming an L-shaped cross section;

wherein in a first position one end of the rail is seated in the corner, with an end face of the rail against the end wall, the first flange flat against the first side wall, and the second flange flat against the second side wall;

wherein the first side wall has at least two protrusions abutting an outer edge of the first flange in the first position to laterally restrict movement of the rail away from the second side wall parallel to the end wall and the first side wall;

wherein the first side wall has at least two tabs extending through respective slots in the first flange, each said tab engaging the first flange adjacent to the respective slot on a side of the respective slot away from the end wall, the tabs in the first position preventing movement of the rail away from the first side wall parallel to the end wall and the second side wall, while permitting movement of the rail away from the end wall to a second position where the tabs align with the respective slots to permit movement of the rail away from the first side wall; and wherein the second side wall has a hole aligning with a hole in the second flange in the first position, at least one of the holes comprising a screw thread, the aligned holes receiving a pin preventing relative movement of the rail and the end unit from the first position to the second position, wherein said pin includes a screw thread that engages with the screw thread in one of said aligned holes, the pin being retained in said aligned holes by engagement of the screw threads.

wherein at least one said protrusion is closer to said end wall than is said hole in said second side wall, and at least one said protrusion is further from said end wall than is said hole in said second side wall.

* * * * *